United States Patent [19]

Fleming et al.

[11] Patent Number: 4,566,338
[45] Date of Patent: Jan. 28, 1986

[54] NONCONTACT TORQUE SENSOR

[75] Inventors: William J. Fleming, Rochester; Dumitru Raceu, Warren, both of Mich.

[73] Assignee: TRW Inc., Cleveland, Ohio

[21] Appl. No.: 633,057

[22] Filed: Jul. 20, 1984

[51] Int. Cl.⁴ .............................................. G01L 3/10
[52] U.S. Cl. ................................. 73/862.36; 73/779; 73/DIG. 2; 324/209
[58] Field of Search .............. 73/862.36, 779, DIG. 2; 324/209

[56] References Cited

U.S. PATENT DOCUMENTS

| 2,459,171 | 1/1949 | Langer et al. | 73/862.36 |
| 3,498,124 | 3/1970 | Soulant . | |
| 3,798,537 | 3/1974 | Dahm | 73/DIG. 2 |
| 4,135,391 | 1/1979 | Dahle | 73/DIG. 2 |
| 4,364,278 | 12/1982 | Horter et al. | 73/DIG. 2 |
| 4,415,054 | 11/1983 | Drutchas | 180/79.1 |

FOREIGN PATENT DOCUMENTS 0032835  2/1984  Japan .................................. 73/862.36

OTHER PUBLICATIONS

SAE Paper #820904, by William J. Fleming.

SAE Paper #820206, by William J. Fleming & Paul W. Wood.

Primary Examiner—Donald O. Woodiel
Attorney, Agent, or Firm—Yount & Tarolli

[57] ABSTRACT

A noncontact torque sensor for measuring torsional loading of a shaft the magnetic permeability of which changes in response to changes in torsion loading of the shaft. The sensor includes an excitation coil for generating a magnetic field passing through the shaft, and sensing coils for detecting changes in the magnetic field caused by changes in the permeability of the shaft. At least one pole is disposed adjacent the shaft, separated by an air gap, for coupling magnetic flux into or out of the shaft. The shaft has a radially extending surface adjacent to which the pole is disposed, and the air gap is represented by the axial spacing between the pole and the radially extending surface. The air gap is thus axial, and does not vary with radial movements of the shaft. In some of the embodiments described, plural poles are arranged symmetrically around the shaft such that other translational movements of the shaft produce offsetting changes in the sizes of various pole air gaps. The sensor is therefore relatively insensitive to vibrations and other translational movements of the shaft relative to the poles.

22 Claims, 11 Drawing Figures

NONCONTACT TORQUE SENSOR

BACKGROUND AND FIELD OF THE INVENTION

The present invention relates to apparatus for sensing the torque applied to a shaft.

Torque is often measured by the same general techniques used to measure other types of structural stress. The most common electrical method of measuring stress is to bond a strain sensitive element, such a piezoelectric strain gauge, directly to the member which will experience the strain to be measured. This technique is not favored in situations in which the stressed member is to be rotated or otherwise moved, however, since it is troublesome to electrically interconnect the strain gauge (which will move) with measurement or display circuits (which will usually remain stationary). In such situations, the stress sensor should preferably be stationary, also, and thus should be capable of measuring stress without being rigidly affixed to the movable member. Noncontact stress sensors have been developed to meet this need.

One class of noncontact stress sensor utilizes the known functional dependence of the magnetic permeability of some ferromagnetic materials upon the degree of stress applied to the material. In general, such sensors operate by generating a magnetic field adjacent a ferromagnetic member whose stress state is to be measured, and by then determining the amplitude of the resulting magnetic flux in the member. The level of flux flowing through the material will be directly related to the magnetic permeability of the material, hence the measured magnetic flux level will increase or decrease depending upon the level of stress applied to the member. The sensor elements which generate and measure the magnetic flux are disposed close to but not in contact with the ferromagnetic member. The sensor elements can therefore remain stationary even when the member, itself, moves.

Torque sensors utilizing the functional relationship between magnetic permeability and stress have been developed for automotive applications. A survey of various types of such magnetic based, noncontact torque sensors is found in SAE (Society of Automotive Engineers) Papers 820904 and 820206. The magnetic-based torque sensors described in these papers can measure torque in a moving shaft, and exhibit both rapid response rates and good stability. In the described torque sensors, however, the measured magnetic flux is dependent upon more than just the magnetic permeability of the shaft. Thus, measured magnetic flux is also dependent upon the size of the air gap between the poles of the torque measuring device and the shaft adjacent to which the poles are placed. Translational movement of the shaft, e.g. vibration and/or axial or transverse shifts in the position of the shaft, may cause the air gaps to either increase or decrease in width, thereby introducing spurious changes in sensor output unrelated to actual torque changes within the shaft. In the past, such problems have been dealt with by carefully machining the shaft so as to have a constant radius, and by minimizing the vibrations and shaft movements introducing the gap variations in the first place.

SUMMARY OF THE INVENTION

The present invention provides a noncontact, magnetic-based torque sensor which is relatively insensitive to both radial and axial movements of the shaft with which the sensor is associated.

In accordance with the present invention, apparatus is provided for sensing torsional loading of a shaft, the magnetic permeability of which changes in response to torsion loading of the shaft. The apparatus comprises elements for generating a magnetic field passing through the shaft, and elements for detecting changes in the magnetic field caused by the permeability changes. The magnetic field is, more specifically, generated by at least one pole disposed adjacent to the shaft for coupling magnetic flux into or out of the shaft, where the pole is separated from the shaft by an air gap. The shaft has a radially extending surface adjacent to which the pole is disposed, whereby the air gap is represented by the axial spacing between the radial surface of the shaft and the pole. The air gap thus does not vary with radial movement of the shaft.

In accordance with another aspect of the present invention, the shaft has first and second radially extending surfaces which face opposite axial directions. At least two poles are then provided, each disposed adjacent to a corresponding one of the first and second radially extending surfaces. The magnetic flux in the poles is detected and an output signal provided which is indicative of the total amount of flux in both of the poles. The output signal is unaffected by axial and radial movement of the shaft since radial movements of the shaft do not change the air gap between the surfaces and the poles, and axial movements of the shaft produce offsetting changes in the widths of the air gaps between the poles and the respective radially extending surfaces.

In accordance with still another aspect of the present invention, apparatus is provided for sensing the torsional loading of a shaft whose magnetic permeability changes along helical stress lines upon changes in torsional loading of the shaft. The apparatus includes an excitation poles disposed adjacent to the shaft for creating a magnetic field passing through the pole and the shaft. Four other poles are disposed closely adjacent to the shaft but are separated from the shaft by respective gaps. The poles provide paths for return of magnetic flux from the shaft to the excitation pole. Two of the poles are disposed adjacent spaced shaft locations which are generally along one of two helical stress lines passing through the point on the shaft adjacent which the excitation pole is disposed. The two poles are located on opposite sides of and equidistant from the excitation pole. The remaining two of the four poles are disposed adjacent spaced shaft locations which are generally along the other of the two helical stress lines passing through the point on the shaft adjacent which the excitation pole is disposed. The poles are also located on opposite sides of and equidistant from the excitation pole. The two poles along each helical stress line are spaced far enough apart from one another along the respective helical stress line that the two air gaps associated with the poles are at diametrically opposing circumferential locations on the shaft. Radial movements of the shaft thus cause offsetting changes in the widths of the two air gaps. Sensing coils are included for sensing changes in the magnetic flux passing through the poles, and for providing an output signal representative of torsional loading on the shaft in accordance with the sensed changes.

BRIEF DESCRIPTION OF THE DRAWINGS

The foregoing and other aspects and advantages of the present invention will become more readily apparent from the following detailed description, as taken in conjunction with the accompanying drawings, wherein.

DETAILED DESCRIPTION

Figure 1A:
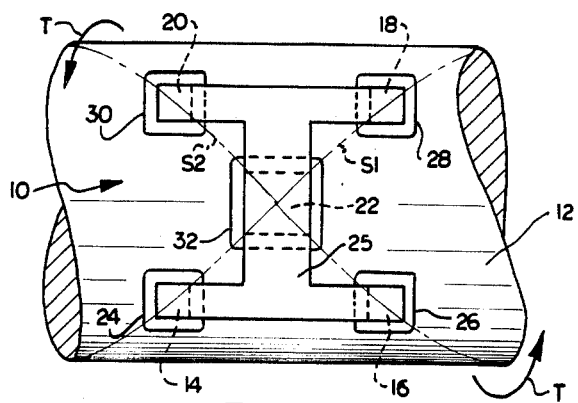
FIGS. 1A, 1B and 1C are respective top, side and end views of a prior art noncontact torque sensor.
Figure 1B:
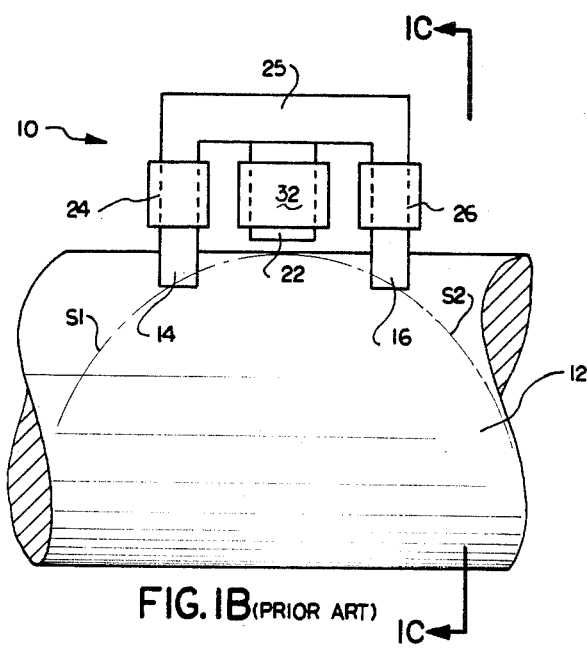
Figure 1C:
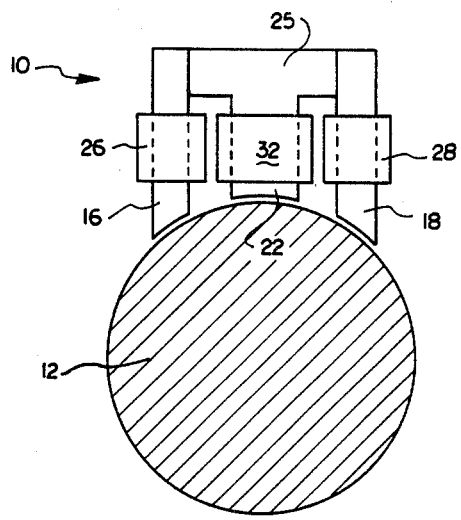

FIGS. 1A, 1B and 1C illustrate a prior art, noncontact, magnetic-based torque sensor. In FIGS. 1A, 1B and 1C, the torque sensor 10 is disposed adjacent the shaft 12 experiencing the torque which is to be measured. The sensor 10 consists essentially of an arrangement of five poles 14, 16, 18, 20 and 22. Each of the five poles has one end disposed adjacent the shaft 12 and its other end joined to the ends of the other four poles through a yoke 25. The yoke and five poles are formed of plural laminations of high permeability magnetic material. Four of the poles 14, 16, 18 and 20 are arranged in a square, with the diagonals of the square oriented on orthogonal helical stress paths S1, S2 along the shaft 12, as viewed from the top (FIG. 1A). The fifth pole 22 is at the center of the square. The ends of all five poles are disposed adjacent the shaft 12, and are machined so that the end surfaces are concentric with the cylindrical outer surface of the shaft.

An excitation coil 32 is wound around the central pole 22, and signal pickup coils 24, 26, 28 and 30 are each wound around a corresponding one of the four corner poles 14, 16, 18 and 20. The coils are conventional, and are formed of multiple turns of enamelled copper wire. The excitation coil 32 is driven by an AC signal source (not shown) such that a magnetic field is induced in the central pole 22 around which the excitation coil is wound. The magnetic field passes through the central pole 22, through the shaft 12, and then returns to the excitation pole 22 through each of the four corner poles 14, 16, 18 and 20 and the yoke 25.

The four corner poles 14, 16, 18 and 20 are similar to one another, are spaced equidistant from the central pole 22, and are displaced from the shaft 12 by equal radial air gaps. Because of this, the amount of flux returning to the excitation coil through each of the four corner poles will be equal as long as the magnetic permeability of the shaft 12 is the same along all four flux paths from the central pole to the corner poles.

The magnetic permeability of the shaft 12 is constant throughout as long as no torque is applied to the shaft. When a torque T is applied to the shaft 12, however, the shaft 12 experiences tension in one helical direction (e.g., along S1, following the diagonal between corner poles 14 and 18), and compression in a second helical direction, orthogonal to the first (e.g., along S2, following the diagonal between corner poles 16 and 20). Magnetic permeability of the ferromagnetic material of which the shaft 12 is formed varies in accordance with the stress of the material, increasing with tension and decreasing with compression. Consequently, the magnetic permeability of the shaft 12 increases in one helical direction and decreases in a second, orthogonal direction upon the application of a torque to the shaft 12.

The permeability change is detected by determining the difference between the amounts of flux along the two orthogonal helical stress lines S1, S2 joining the corner poles to the center pole. To determine the flux difference, the outputs of the pickup coils 24 and 28 are added together, and the outputs of the pickup coils 26 and 30 are added together. The combined output of pickup coils 26 and 30 is then subtracted from the combined output of pickup coils 24 and 28. The difference signal will be zero as long as shaft 12 is untorqued, since in that case the magnetic permeability of the shaft is equal along lines S1 and S2. When a torque is applied to shaft 12, on the other hand, the difference signal will be either positive or negative, depending upon the direction of the torque, and will have a magnitude which is directly indicative of the magnitude of the torque.

Unfortunately, the level of magnetic flux passing through the corner poles of the FIG. 1 apparatus is dependent not only upon the magnetic permeability of the shaft 12 along the helical lines of stress, but also upon the width of the air gaps between the poles and the shaft 12. Thus, changes in the air gaps may affect the output signal provided by the noncontact torque sensor. Changes in gap width may be caused by radial movements of the shaft 12. Radial vibrations of the shaft, for example, introduce spurious AC variations in the output signal provided by the sensor. The spurious AC variations in sensor output can be reduced by adding substantial signal filtering. The added filtering is undesirable, however, because it reduces the response rate of the system. The position of the shaft 12 may shift radially on a more long term basis, moreover, producing spurious sensor outputs which cannot be eliminated through filtering. It would be desirable if spurious output signals produced by all variations in air gap could be reduced or eliminated altogether.

Figure 2A:
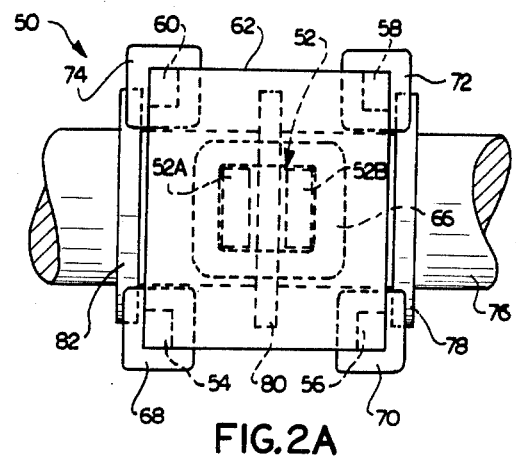
FIGS. 2A, 2B and 2C are respective top, side and end views of a noncontact torque sensor in accordance with the teachings of the present invention.
Figure 2B:
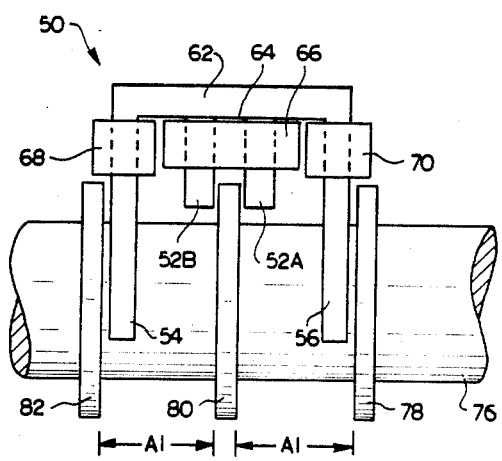
Figure 2C:
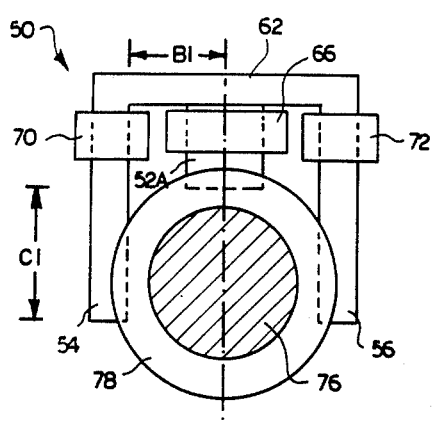

FIGS. 2A, 2B and 2C are three different views of one embodiment of a noncontact torque sensor in accordance with the teachings of the present invention. The noncontact sensor 50 of FIG. 2 includes five poles 52, 54, 56, 58 and 60. The five poles are joined by a yoke 62, shown in FIG. 2A as comprising a rectangular plate. The poles and the yoke are again constructed of plural lamina of high magnetic permeability material, such as silicon iron. As in FIG. 1, four of the poles 54, 56, 58 and 60 are arranged at the corners of the rectangular yoke 25, and the remaining pole 52 is located at the center of the yoke 25. A transverse groove 64 splits the central pole 52 into two pole pieces 52a and 52b. An excitation coil 66 is wound around the entire central pole 52, and signal pickup coils 68, 70, 72 and 74 are each wound around a corresponding one of the four corner poles.

In the FIG. 2 embodiment, the shaft 76 carries three annular ferromagnetic flanges 78, 80 and 82. The poles are disposed adjacent the flanges such that all air gaps in the flux paths are between the radially extending surfaces of the flanges and the poles. More particularly, the noncontact torque sensor 50 is positioned over the shaft such that the central flange 80 is received in the transverse groove 64 in the central pole 52. Thus, one of the pole pieces 52A is on one axial side of the central flange, and the other pole piece 52B is on the opposite axial side of the flange 80.

The two outside flanges 78 and 82 are axially spaced from the central flange 80 by an amount A1 equal to one quarter of the pitch of the helical stress lines on the shaft 76. (In other words, the outside flanges are spaced from the central flange 80 by one quarter of the circumference of the shaft, since the pitch of the helical lines of principal stress on the shaft is known to be equal to the circumference of the shaft.) Thus, the helical stress line passing through the point on the surface of the shaft adjacent to which the central pole 52 is located travels 90° around the shaft before arriving at either of the outside flanges 78 or 80. For maximum sensitivity, therefore, the outer poles 54, 56, 58 and 60 should be arranged to receive flux from the outside flanges 78 and 82 at points 90° around the shaft relative to the point of adjacency of the central pole 52. The poles 54 and 56 are then adjacent to the shaft 76 at points diametrically opposite the points at which the poles 58 and 60 are adjacent to the shaft 76.

The corner poles 54, 56, 58 and 60 are transversely separated from the center of center pole 52 by an amount B1 which is greater than the radius of the shaft 76. Also, all four corner poles 54, 56, 58 and 60 are long enough that they extend beyond the radial center of the shaft, on either side of the shaft. This can perhaps best be seen in FIG. 2C. The axial spacing of the corner poles 54, 56, 58 and 60 relative to the central pole 52 is selected such that each of the corner poles is substantially closer to the radially extending surface of its associated flange than it is to the cylindrical surface of the shaft (e.g., 1 millimeter versus 10 millimeters). Thus, the majority of the magnetic flux passes across the axial gaps between the corner poles and the flanges, rather than across the radial gap between the corner poles and the shaft itself.

The apparatus shown in FIG. 2 is largely insensitive to both lateral and axial movements of the shaft 76, so long as the outputs of diagonally opposing signal pickup coils are added together. Thus, if the shaft 76 shifts axially to the left, as viewed in FIGS. 2A and 2B, the flange 78 approaches corner poles 56 and 58, thereby reducing the air gaps between those poles and the flange 78. At the same time, however, the other outside flange 82 withdraws from the other corner poles 54 and 60, thereby increasing the air gaps between those poles and the flange 82 by an offsetting amount. Consequently, the total amount of flux passing through poles 54 and 58 and the total amount of flux passing through the poles 56 and 60 does not change. The effective air gap between the central flange 80 and the central pole 52 also remains substantially constant, since flange 80 moves nearer to pole piece 52B but further away from pole piece 52A.

A similar effect takes place upon radial movements of the shaft 76. If, for example, the shaft 76 moves slightly to the left, as viewed in FIG. 2C, the flanges 78 and 82 will overlap corner poles 54 and 56 to a somewhat greater extent, thereby providing greater coupling of magnetic flux through those poles. At the same time, however, the outside flanges 78 and 82 move away from the other corner poles 58 and 60, thereby reducing the flux coupling with those poles. The total amount of flux passing through each diagonally opposite pair of corner poles thus still remains substantially constant. If the shaft 76 moves slightly upward (again, as viewed in FIG. 2C), the width and cross sectional area of the air gaps between the outside flanges and the corner pole pieces will remain substantially constant. The cross sectional area of the air gaps between the central pole 52 and the central flange 80 will increase, providing somewhat greater magnetic flux coupling between the central pole and the shaft 76. This effect does not significantly influence the output signal, however, since it increases the amount of flux passing through all four corner poles to an equal extent. In any event, the signal processing circuit shown in FIG. 3 (described hereinafter) includes signal normalization to automatically correct the torque sensor output signal for such variations in the coupling between the shaft 76 and the central pole 52.

The improvements afforded by the apparatus of FIGS. 2A, 2B, and 2C are primarily attributable to two features of the apparatus. First, the air gaps between the shaft and the pole pieces are all axial air gaps, and thus they do not increase or decrease upon radial shifts of the shaft 76. Secondly, the four corner poles are disposed in a symmetrical arrangement with the shaft 76. The two poles 54 and 56 are on the diametrically opposite side of the shaft relative to the poles 58 and 60, and thus radial displacements of the shaft which might increase of decrease the cross sectional area of one or the other air gaps will automatically affect the cross sectional area of the air gap on the opposite side of the shaft by an offsetting amount. Similarly, the corner poles are adjacent opposite axial sides of the flanges 78 and 82. Thus, an axial shift of the shaft 76 which would increase the width of the air gaps associated with one flange will produce an offsetting decrease in the width of the air gaps associated with the other flange. The result is a torque sensor which is largely insensitive to vibrations and other mechanical disturbances influencing the relative positions of the shaft 76 and sensor assembly 50.

The FIG. 2 apparatus enjoys several other advantages over the prior art of FIG. 1. In FIG. 2, two parallel, flat surfaces define each air gap. Such flat surfaces are substantially easier to machine than are the curved surfaces machined into the pole piece ends in the prior art of FIG. 1. Moreover, the flux paths between the center and corner poles are much longer in the FIG. 2 apparatus than in the prior art approach of FIG. 1. A change in the magnetic permeability over that flux path produces a greater change in total flux than it would over the comparatively shorter path of the FIG. 1 apparatus. Consequently, the FIG. 2 apparatus has greater sensitivity to applied torque, and can more readily be used to measure torque in small diameter shafts.

Figure 3:
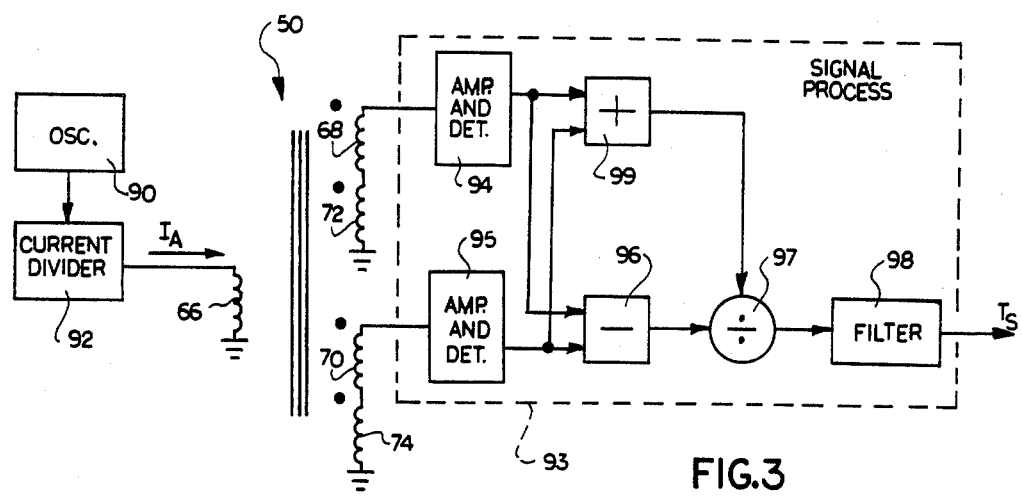
FIG. 3 is a block diagram of a circuit in which the torque sensor of FIG. 2 is used.

FIG. 3 is a block diagram of a signal processing circuit for use in conjunction with the apparatus of FIG. 2. As shown in FIG. 3, the excitation coil 66 is driven by an AC signal provided by an oscillator 90. A current driver 92 converts the AC voltage signal provided by the oscillator 90 into an AC current signal for application to the excitation coil 66. The AC current signal has a stable, pre-established peak magnitude. The magnetic field generated by the excitation coil is transmitted to the pickup coils 68, 70, 72 and 74 through the air gaps, flanges, shaft, and pole pieces as described above with respect to FIG. 2.

The diagonally opposing signal pickup coils are connected in series so that their output signals effectively add together. The resulting output signals are processed in a signal processing circuit 93. More specifically, one end of the series-connected pair of pickup coils 68 and 72 is connected to signal ground, whereas the other end is connected to the input of an amplifier and detector circuit 94 of conventional construction. The other series-connected pair of signal pickup coils 70 and 74 is similarly connected between ground and an amplifier and detector circuit 95. Each of the amplifier and detector circuits 94 and 95 amplifies the AC signal provided to it by its corresponding pair of signal pickup coils, and then detects the peak amplitude of the amplified AC signal. The peak signals provided at the outputs of circuits 94 and 95 vary in accordance with variations in the amplitude of the peaks of the AC signals appearing at their inputs. The peak signals are subtracted from one another in a signal subtractor circuit 96 to provide a difference signal.

Divider 97 normalizes the difference signal by dividing it by a second signal representative of the total magnetic flux passing through all four corner poles. The second signal is provided by adder circuit 99, which adds the two output signals provided by the amplifier and detector circuits 94 and 95. Ideally, the total magnetic flux will remain constant, hence the output of adder circuit 99 will also remain constant. If the total flux does change, however, the resulting incidental change in the gain of the difference signal at the output of signal subtractor 96 will automatically be compensated for in divider 97 due to the corresponding change in the output of adder circuit 99. The normalized difference signal is filtered by a filter circuit 98.

The output signal $T_S$ of the filter circuit 98 represents, and varies in accordance with, the torque applied to the shaft 76. When the shaft 76 is under no torque, the magnetic flux is coupled to signal pickup coils 68, 70, 72 and 74, to equal extents. The outputs of amplifier and detector circuits 94 and 96 are thus equal, and the output signal $T_S$ will be zero. When a torque is applied to the shaft 76, however, changes in magnetic permeability in the shaft 76 along the helical flux paths joining the central pole 52 to the four corner poles 54, 56, 58 and 60 cause the outputs of amplifier and detector circuits 94 and 95 to differ from one another by an extent which is directly proportional to the magnitude of the applied torque and to the total amount of flux in the magnetic circuit. The dependency upon total flux is eliminated by the normalization introduced by divider 97, hence the output signal $T_S$ of the FIG. 3 circuitry will have a magnitude and polarity directly representative of the magnitude and direction of the torque applied to the shaft 76. As stated previously, the output $T_S$ of the FIG. 3 circuitry will be largely insensitive to vibrations and other minor axial and transverse displacements of the shaft 76 relative to the sensor assembly 50.

Figure 4A:
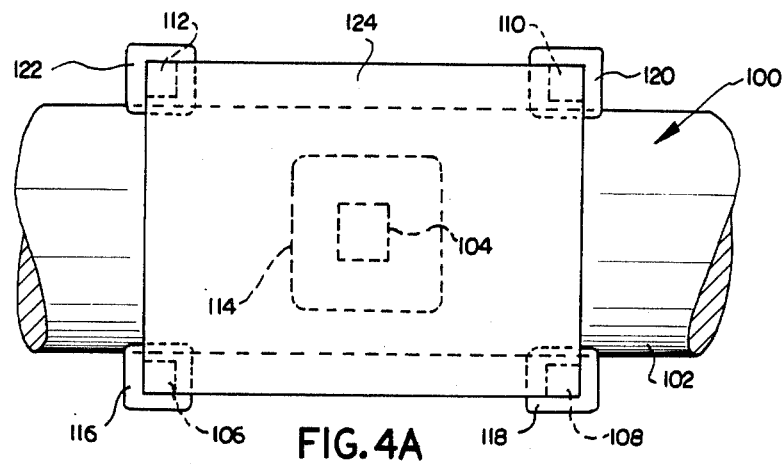
FIGS. 4A, 4B and 4C are respective top, side and end views of a second embodiment of a noncontact torque sensor in accordance with the teachings of the present invention.
Figure 4B:
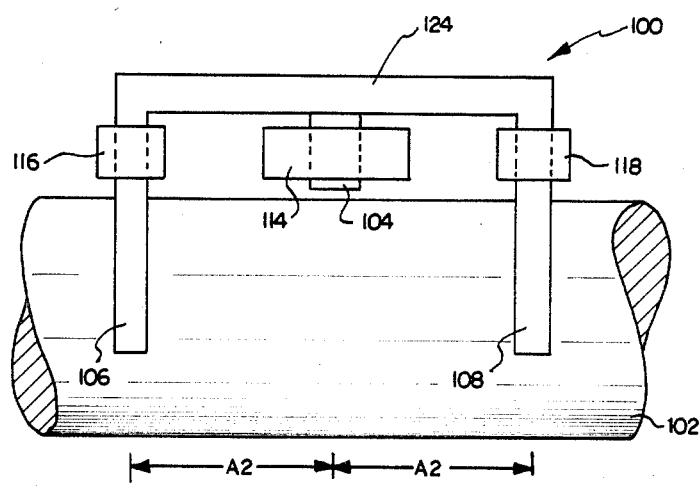
Figure 4C:
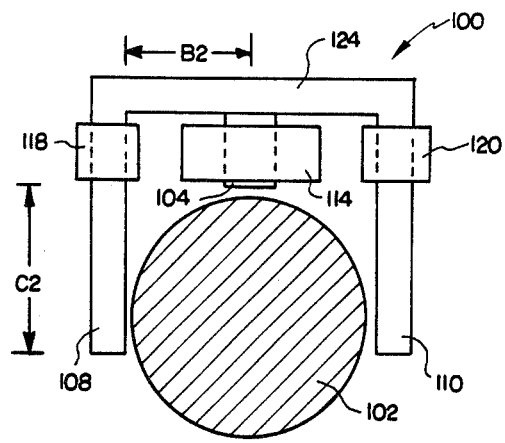

FIGS. 4A, 4B and 4C are three different views of a second embodiment of a noncontact torque sensor in accordance with the teachings of the present invention. In the embodiment of FIG. 4, the sensor assembly 100 is somewhat similar to the sensor assembly 50 of the FIG. 2 apparatus. The shaft 102, however, does not include the three flanges of FIG. 2. The sensor assembly 100 again includes five poles 104, 106, 108, 110 and 112. The central pole 104 is surrounded by an excitation coil 114, and signal pickup coils 116, 118, 120 and 122 are wound around the four corner poles. The five poles are joined by a yoke 124 similar to the yoke 62 of FIG. 2.

In the embodiment of FIG. 4, the pole piece air gaps are between the cylindrical surface of the shaft 102 and the inside surface of the corresponding pole piece. Each air gap exists along a line of helical stress passing through the point on the shaft 102 adjacent to which the center of the central pole 104 is located. The corner poles are disposed far enough apart along the helical lines of stress, however, that the air gaps associated with pole pieces 106 and 108 are at circumferential locations diametrically opposite the circumferential positions of the air gaps associated with pole pieces 110 and 112. To provide the proper spacing, the pole pieces 106, 108, 110 and 112 are all spaced axially from the center of pole 104 by a distance A2 equal to approximately one-quarter of the pitch of helical stress lines in the shaft 102. The corner pole pieces are transversely displaced from the center of the center pole piece 104 by an amount such that the distance B2 between the center of the center pole 104 and the inside surface of each corner pole is equal to the radius of the shaft 102 plus the desired corner pole air gap. Each of the corner poles is longer than the center pole by an amount C2 which is somewhat greater than the radius of the shaft 102, whereby again the corner poles straddle the shaft.

With these spacings, the air gap between each corner pole and the shaft 102 corresponds to the radial gap between the shaft 102 and the facing inside surface of the corner pole. The air gaps are located at diametrically opposing positions around the shaft 102, whereby radial movements of the shaft cause offsetting changes in the sizes of the corner pole air gaps on opposite sides of the shaft. Radial movements of the shaft therefore do not introduce substantial spurious signal components into the combined outputs of the signal pickup coils. The FIG. 4 torque sensor may, of course, be used in conjunction with the signal processing circuitry of FIG. 3.

It may be desirable to eliminate two of the four corner poles from the FIGS. 2 and 4 embodiments in some instances. The four corner pole arrangements shown in FIGS. 2 and 4 are useful where the associated shaft is, or may be, rotated at a high rate of speed. Rotation of the shaft causes eddy currents to arise in the shaft which, in turn, cause the magnetic flux in the shaft to bunch towards one axial side of the center pole. The output signals provided by a four corner pole sensor are not affected by the bunching of flux, however, since the total flux through each diagonal pair of corner poles remains essentially constant. In some applications, the shaft may not rotate rapidly enough to introduce substantial axial bunching of the magnetic flux. In those applications, two of the corner poles (e.g. poles 56 and 58 of FIG. 2, or poles 108 and 110 of FIG. 4) can be eliminated. When two corner poles are eliminated from the embodiment of FIG. 2, however, shifts in the axial air gaps of the remaining two corner poles will not be compensated by matching shifts of other air gaps diagonally opposite the central pole. The two remaining air gaps will, however, both be about the same width regardless of the axial position of the shaft. Consequently, axial movements of the shaft will only affect the gain of the torque signal. The gain changes can be eliminated by signal normalization as shown in FIG. 3.

Figure 5:
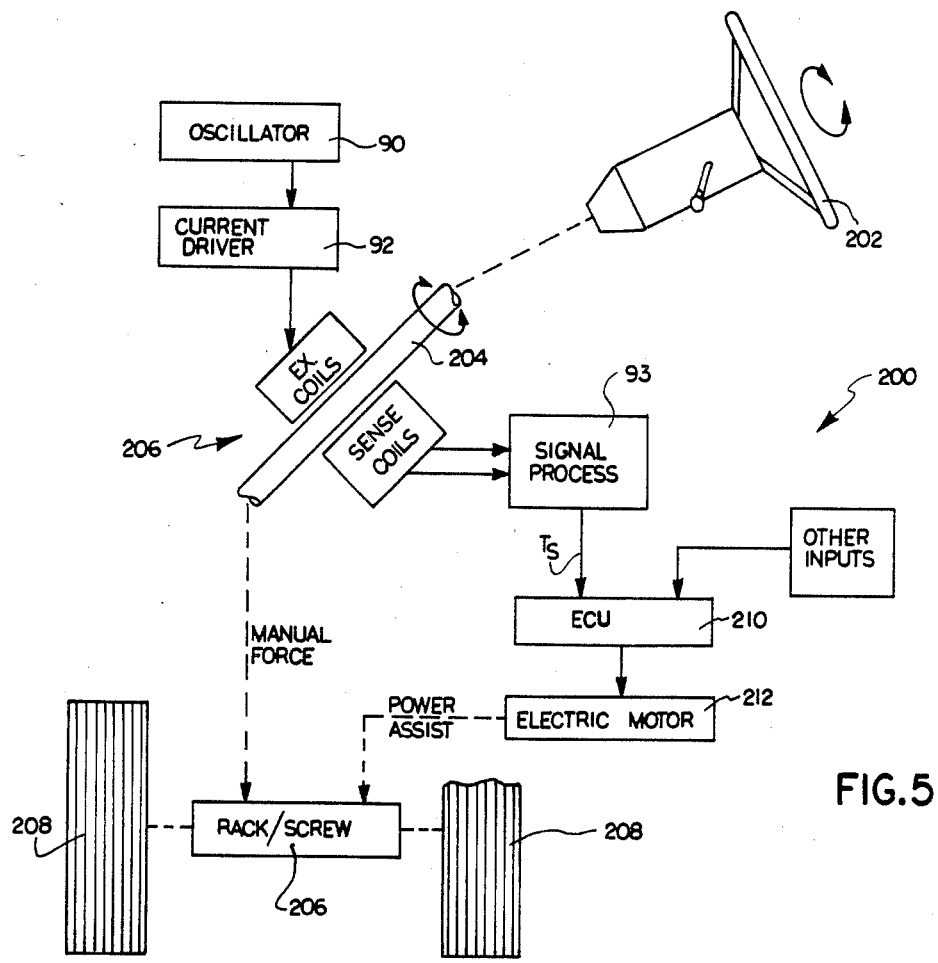
FIG. 5 is a block diagram of a power steering system incorporating the torque sensor of the present invention.

FIG. 5 illustrates a motor vehicle power steering system wherein the noncontact torque sensors of FIGS. 2 and 4 could advantageously be employed. In the FIG. 5 power steering system 200, torque manually applied to a steering wheel 202 by the motor vehicle operator is transmitted through a steering shaft 204 to a rack or screw arrangement 206 which steers the dirigible wheels 208 of the motor vehicle. The noncontact torque sensor 206 (including the elements described previously with respect to FIG. 3) is associated with the steering shaft 204 such that an output signal $T_S$ is provided which is representative of the direction and magnitude of the torque being applied to the steering shaft 204. The torque signal $T_S$ is applied to an electronic control unit 210 along with other input signals representative, for example, of the speed of the vehicle. The electronic control unit (ECU) 210 controls an electric motor 212 which is coupled to the rack or screw arrangement 206. The electronic control unit 210 operates the electric motor 212 in a direction to reduce the torque applied to the steering shaft 204. A system of this sort is described in U.S. Pat. No. 4,415,054, assigned to the assignee of the present application.

Although the invention has been described with respect to a preferred embodiment, it will be appreciated that various rearrangements and alterations of parts may be made without departing from the spirit and scope of the present invention, as defined in the appended claims. For example, the poles utilized in the FIGS. 2 and 4 embodiments may have shapes substantially different than those shown, and the electronic circuit used to combine and process the outputs of the signal pickup coils may be different from that shown in FIG. 3. In some cases, it may be desirable to connect the coils 68 and 72 in anti-series with the coils 70 and 74 thereby performing the signal subtraction function by direct connection of the coils rather than through use of a separate signal subtraction circuit.

What is claimed is:

1. Apparatus for sensing torsional loading of a shaft the magnetic permeability of which changes in response to changes in torsion loading upon said shaft, said apparatus comprising means for generating a magnetic field passing through said shaft, and means for detecting changes in said magnetic field caused by said permeability changes, said means for generating including at least one pole means disposed adjacent said shaft for coupling magnetic flux into or out of said shaft, said pole means being separated from said shaft by an air gap, and said shaft having a radially extending surface adjacent to which said pole means is disposed, whereby said air gap is represented by the axial spacing between said radially extending surface and said pole means and thus does not vary with radial movement of said shaft.

2. Apparatus as set forth in claim 1, wherein said shaft has first and second radially extending surfaces facing in opposite axial directions, said means for generating includes at least two pole means each disposed adjacent to a corresponding one of said first and second radially extending surfaces, and said means for detecting including means for detecting magnetic flux in said pole means and providing an output signal indicative of the total amount of flux in both said pole means, said output signal being unaffected by axial and radial movements of said shaft.

3. Apparatus as set forth in claim 2, wherein said means for detecting said magnetic flux comprises a first coil wound about one of said pole means, a second coil wound about the other of said pole means, and means for providing said output signal from the signals provided by said first and second coils.

4. Apparatus as set forth in claim 3, wherein said means for providing said output signal comprises means for connecting said first and second coils in series whereby a sum signal appears across said series connected coils which is representative of the total amount of flux in both said pole pieces.

5. Apparatus as set forth in claim 1, wherein said means for generating said magnetic field comprises a first pole having an excitation coil wound around it, said first pole having a portion disposed adjacent said shaft such that magnetic flux generated by said excitation coil is coupled into said shaft, second and third poles each having a portion disposed adjacent said shaft for receiving magnetic flux from said shaft, and yoke means for magnetically coupling said first, second and third poles such that flux received by said second and third poles from said shaft is returned to said first pole through said yoke means, and further wherein said means for detecting comprises a first signal pickup coil wound around said second pole and a second signal pickup coil wound around said third pole, each said signal pickup coil providing an output signal.

6. Apparatus as set forth in claim 5, wherein said radially extending surface extends around the circumference of said shaft at a location axially separated from said first pole by a distance approximately equal to one quarter of the pitch of helical stress lines around said shaft, and wherein said second and third poles are disposed adjacent said radial surface such that said second and third poles receive flux from said shaft principally across axial gaps separating said second and third poles from said radially extending surface.

7. Apparatus as set forth in claim 6, wherein said axial air gaps associated with said second and third poles are each circumferentially spaced from said first pole by approximately ninety degrees but are on opposite circumferential sides of said first pole, whereby said air gaps are on diametrically opposite sides of said shaft.

8. Apparatus as set forth in claim 7, further comprising means for subtracting the output signal provided by said first signal pickup coil from the output signal provided by said second signal pickup coil, thereby providing a difference signal indicative of the magnitude and direction of torque applied to said shaft.

9. Apparatus as set forth in claim 1, wherein said shaft has an annular flange defining a radially extending surface on both axial sides of the flange, and further wherein said at least one pole means comprises a first pole having a transverse groove in it adapted to receive said flange, thereby said first pole may be positioned to straddle said flange and, when thus positioned, is separated from each axial side of said flange by an axial air gap small enough that said magnetic flux is coupled into or out of said shaft principally through said axial air gaps.

10. Apparatus as set forth in claim 9, wherein said generating means includes said first pole and further comprises an excitation coil wound around said first pole for generating a magnetic field in said pole, said magnetic field being coupled into said shaft through said axial air gaps and said flange.

11. Apparatus as set forth in claim 10, wherein said generating means further comprises a first and second pair of corner poles, all disposed adjacent to but separated from said shaft by respective gaps, said corner poles all providing paths for return of said magnetic flux from said shaft to said first pole, the two corner poles of said first pair being disposed at spaced locations generally along one of two helical stress lines passing through a point on said shaft adjacent said first pole, said spaced locations being on opposite axial sides of and equidistant from said first pole, and the two corner poles of said second pair being disposed at spaced locations generally along the other of the two helical stress lines and located on opposite axial sides of and equidistant from said first pole, said poles of each pair of corner poles being spaced far enough apart from one another that the two air gaps associated with each said pair of corner poles are at diametrically opposing circumferential locations around said shaft, whereby radial movements of said shaft cause offsetting changes in the sizes of said two air gaps.

12. Apparatus as set forth in claim 11, wherein second and third annular flanges are also attached to said shaft, axially spaced on either side of the first annular flange by approximately one quarter of the pitch of said helical stress lines, and wherein each said corner pole is disposed adjacent a radially extending surface on one of said second and third annular flanges, whereby flux is coupled between said corner poles and said shaft principally across axial gaps separating said corner poles from said annular flanges.

13. Apparatus as set forth in claim 1, wherein said generating means comprises four poles arranged in the corners of a rectangle, a pole disposed in the center of said rectangle, a yoke for magnetically coupling said corner poles and said center pole, and an excitation coil wound around said center pole for generating a magnetic field in said center pole, and wherein said poles are disposed adjacent said shaft such that said magnetic field passes through said center pole, across an axial air gap into said shaft, through said shaft along two orthogonal helical lines of stress, across axial air gaps into said corner poles, through said corner poles and said yoke, and thus back to said center pole.

14. Apparatus for sensing the torsional loading of a shaft the magnetic permeability of which changes along helical stress lines upon changes in torsion loading of said shaft, said apparatus comprising:

excitation means disposed adjacent to said shaft for creating a magnetic field to provide magnetic flux through said excitation means and said shaft;

a plurality of poles disposed adjacent to but separated from said shaft by respective air gaps, said poles providing paths for return of said magnetic flux from said shaft to said excitation means, one of said poles being disposed at a location generally along one of two helical stress lines passing through the point on said shaft adjacent said excitation means, and another pole being disposed at a location generally along the other of said two helical stress lines;

said one and another poles being on the same axial side of said excitation means and each angularly separated by 90° from said excitation means along said helical stress lines such that the two air gaps associated with said poles are at diametrically opposing circumferential locations around said shaft, whereby radial movements of said shaft cause offsetting changes in said two air gaps; and means for sensing changes in the magnetic flux passing through said poles, and for providing an output signal in accordance with said changes.

15. Apparatus as set forth in claim 14, wherein at least one of said gaps between said poles and said shaft is an axial gap.

16. Apparatus as set forth in claim 14, wherein all of said gaps between said poles and said shaft are axial gaps.

17. Apparatus as set forth in claim 14, wherein plural annular flanges are attached to said shaft, and wherein each of said poles is disposed adjacent a radially extending surface of one of said flanges such that said magnetic flux is coupled between said poles and said shaft principally across the axial gaps separating said flanges from said poles.

18. Apparatus as set forth in claim 14, wherein said means for sensing changes comprises a plurality of sensing coils, each wound around a different one of said poles.

19. Apparatus as set forth in claim 18, further comprising signal processing means responsive to the signals provided by said sensing coils for providing an output signal indicative of the direction and magnitude of torsional loading on said shaft.

20. Apparatus as set forth in claim 14, wherein said plurality of poles further includes two other poles also located along said two helical stress lines but on the opposite axial side of said excitation means with respect to said one and another poles, and where said sensing means comprises means for sensing changes in the magnetic flux in all four of said poles.

21. Apparatus as set forth in claim 20, wherein said sensing means comprises means for sensing and indicating the difference between (A) the total flux in the two poles along one of said two helical stress lines, and (B) the total flux in the two poles along the other of said two helical stress lines.

22. Apparatus as set forth in claim 20, wherein plural annular flanges are attached to said shaft, and wherein each of said poles is disposed adjacent a radially extending surface of one of said flanges such that said magnetic flux is coupled between said poles and said shaft principally across the axial gaps separating said flanges from said poles.

* * * * *